United States Patent [19]

Ahmed

[11] 3,831,113

[45] Aug. 20, 1974

[54] RELAXATION OSCILLATOR

[75] Inventor: Adel Abdel Aziz Ahmed, Annandale, N.J.

[73] Assignee: RCA Corporation, New York, N.Y.

[22] Filed: June 1, 1973

[21] Appl. No.: 365,840

[52] U.S. Cl. .......... 331/111, 307/228
[51] Int. Cl. .......... H03k 4/50
[58] Field of Search .......... 331/111; 307/228

*Primary Examiner*—John Kominski

[57] ABSTRACT

A voltage comparator compares the voltage across a capacitor which is being charged with a reference voltage of a first value. When the voltage across the capacitor becomes equal to this first value, the comparator causes the reference voltage to switch to a second lower value and, a short time later, the capacitor is caused to switch from a charging to a discharging condition. When the two voltages again become equal, the process is reversed. In a preferred circuit, the means employed to delay the switching of the capacitor condition comprises a threshold detector connected to receive the reference voltage applied to the comparator and having a threshold intermediate the first and second reference voltage values.

17 Claims, 6 Drawing Figures

RELAXATION OSCILLATOR

The present invention relates to a relaxation oscillator of a type susceptible to construction in monolithic integrated circuit form.

Relaxation oscillators are known in which the potential appearing across a timing capacitor which is periodically charged and discharged, is compared with a reference potential signal to provide an output signal. The output signal has a first and second values depending upon whether the potential across the timing capacitor is more positive or more negative than the reference signal potential. When the comparator output signal changes value, the reference signal potential is caused to change value. Subsequently, a control signal responsive to the comparator output signal determines whether the timing capacitor is to charge or discharge during the next part of the oscillation cycle.

The inventor has found that this determination must be made after a suitable delay from the time that the reference signal has changed its value. If such a delay is not introduced, an equilibrium condition may obtain in which oscillation no longer occurs. In discrete circuitry, this delay is naturally provided by the electrode capacitance of the semiconductor devices and by lead inductance. Because of this, the undesired equilibrium condition does not readily evidence itself, and it is probably for this reason that the need for the delay has not been recognized by designers of discrete circuitry. In an integrated circuit, these sources of delay do not exist and other provision for such delay must be made.

In a circuit embodying the present invention, this delay is provided by lumped circuit elements. In a preferred embodiment of the present invention, this delay is provided by a threshold detector having an input circuit coupled to receive the reference potential signal and having an output circuit providing a signal to control whether the timing capacitor is to be charged or discharged. The threshold detector does not change the capacitor condition until a transition of the reference signal from one of its states to the other has substantially begun to proceed.

Figure 1:
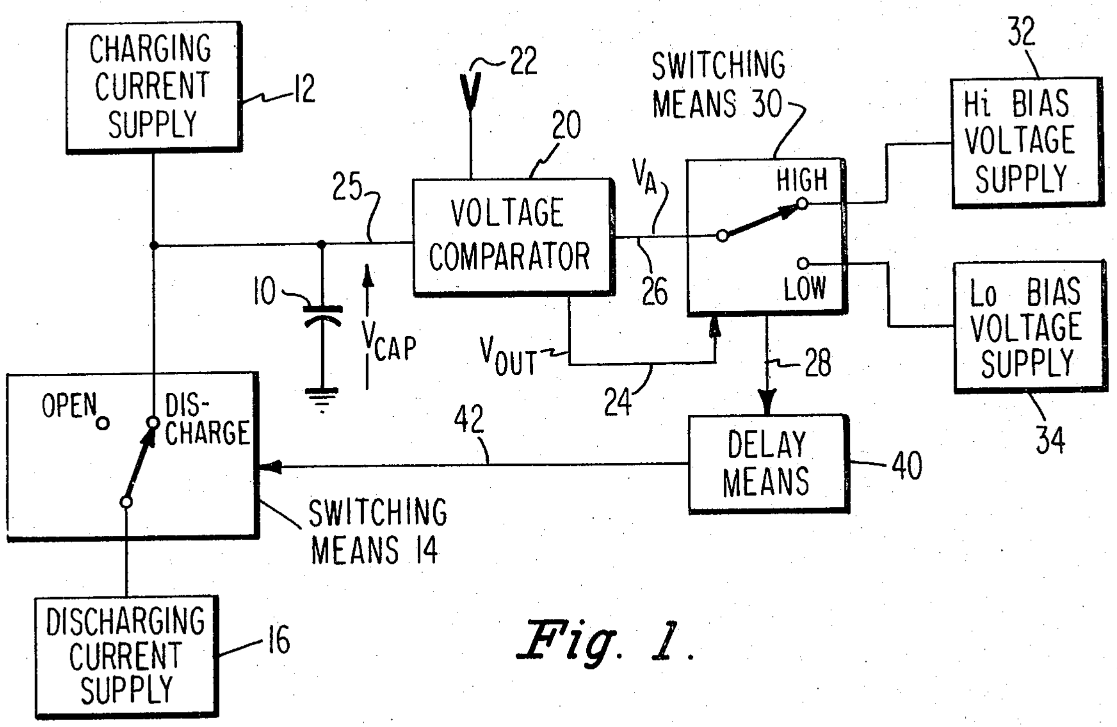
FIG. 1 is a block schematic diagram of apparatus such as may embody the present invention.

Referring to FIG. 1, timing capacitor 10 is connected to a "charging" current supply 12 and may be connected by switching means 14 to a "discharging" current supply 16. The switching means 14 is electrically controlled as shall be subsequently explained. The direct currents supplied by supplies 12 and 16 are of opposite polarity and for the purposes of explanation will be assumed to be positive and negative, respectively. The current supplied by supply 16 is larger than that supplied by supply 12.

When switching means 14 is in its "open" condition, such that current supply 16 is not connected to capacitor 10, current supply 12 will supply a positive current to capacitor 10. As a result, charge will be conducted to capacitor 10, causing the potential $V_{CAP}$ appearing thereacross to increase in accordance with Coulomb's Law.

When switching means 14 is in its closed or discharge condition, only a portion of the current demanded by the supply 16 is supplied by the smaller current of supply 12. The rest of the current demanded by supply 16 must be supplied from the capacitor 10. As a result, charge will be removed from the capacitor 10, causing $V_{CAP}$ to decrease in accordance with Coulomb's Law.

If the switching means 14 is switched at regularly recurring intervals of equal duration, the waveform of the potential across capacitor 10 will be serrasoidal, i.e., sawtoothed, in nature. A voltage comparator 20 is used to sense the potential across the capacitor 10 to determine when this switching is to be done. The voltage comparator 20 is provided with a connection 22 for coupling relaxation oscillations from the oscillator to other circuitry and with a connection 24 at which a signal $V_{OUT}$ appears for use in further portions of the relaxation oscillator. In particular, the connection 24 applies $V_{OUT}$ to switching means 30 to control its condition. When the potential $V_{CAP}$ appearing on input connection 25 to the voltage comparator 20 is larger than the potential $V_A$ appearing between ground reference potential and input connection 26 to the voltage comparator 20, $V_{OUT}$ will be in a first state; when $V_A$ is larger than $V_{CAP}$, $V_{OUT}$ will be in a second state. The first and second states, for example, may correspond to first and to second potential levels, respectively, the first more positive than the second. The signal $V_{OUT}$ appearing on connection 24 is also coupled to delay means 40 via connection 28 from the switching means 30. For purposes of straightforward explanation of FIG. 1, the signal $V_{OUT}$ will also be considered to appear on connection 28. In an actual embodiment of the present invention, shown schematically in FIG. 5, delay means 40 comprises a threshold detector to which $V_{OUT}$ is not applied directly as input signal but rather which responds to the condition of the switching means 30—that is, to the value of $V_A$ appearing at input line 26 to the comparator.

For purposes of the ensuing explanation, assume that switching means 14 initially is in its "open" condition and that capacitor 10 is being charged from supply 12. In the timing diagram FIG. 2, this would be at a time prior to time $t_1$.

At time $t_1$, when the potential $V_{CAP}$ across capacitor 10 increases beyond a first threshold potential, $V_1$, the voltage comparator 20 responds to switch $V_{OUT}$ from a first output signal state to a second output signal state. This first threshold potential corresponds to a high bias voltage applied to voltage comparator 20 by switching means 30 when in its "high" condition. This high bias voltage is supplied from supply 32.

The switching means 30 is in its "high" condition when the output signal on connection 24 is in its first state. When the output signal on connection 24 is placed into its second state at time $t_1$, it causes the switching means 30 to switch to its "low" condition as shown in the timing diagram of FIG. 2.

In its low condition, switching means 30 applies a low bias voltage from supply 34 to voltage comparator 20, which low bias voltage is less positive than the high bias voltage. Therefore, the comparator 20 now—as a result of the change in the state of the output signal—has a lower threshold voltage $V_2$ against which $V_{CAP}$ is to be compared. This is a positive feedback in the sense that at time $t_1$, $V_{CAP}$, only was slightly greater than the reference voltage (which was the high reference voltage $V_1$) whereas immediately following time $t_1$, $V_{CAP}$ (which has not changed much in value) has become very much greater than the reference voltage (because the switching means 30 has been actuated and the reference voltage has changed to the low value $V_2$). Such feedback positively latches the output signal on connections 24 in its second state. That is, it eliminates any dither in the comparator output signal transition from its first to second state. ("Dither" is an uncertainty in the transition of a signal from one state to another.)

Delay means 40 provides a control signal to switching means 14 via connection 42, which control signal is responsive to $V_{OUT}$ but having signal transitions delayed with respect to those of $V_{OUT}$. Since switching means 30 switches in response to the signal transitions appearing on connection 24 and switching means 14 switches in response to these same signal transitions delayed by a fixed amount of time, switching means 30 switches at time $t_1$ and switching means 14 switches at a later time $t_2$, as shown in the FIG. 2 timing diagram.

Figure 2:
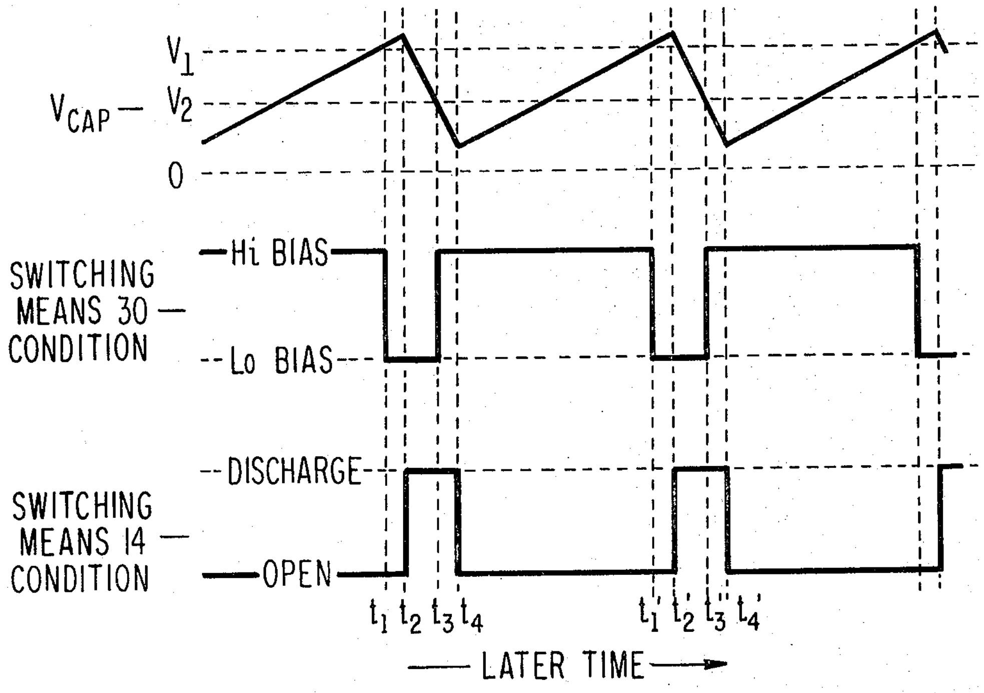
FIG. 2 is a timing diagram helpful in understanding the delay requirements for successful operation of this apparatus.

Because of the delay above, the charging current supply 12 continues to charge capacitor 10 for a time (the interval $t_1$, $t_2$ after switching means 30 has switched to the low state, as revealed in the plot of $V_{CAP}$ between times $t_1$ and $t_2$ in FIG. 2. This delay from time $t_1$ to time $t_2$ permits the output signal of the voltage comparator 20 to become securely latched into its new second state before switching means 14 is actuated. There is no chance that the switching means 14 will be switched into its discharged position prematurely to decrease the loop gain of this positive-feedback latching operation and thereby permit the system to acquire an undesired equilibrium condition in which oscillations would stop.

After switch 14 is switched into its discharge position at time $t_2$, the discharge current supply 16 removes charge from the timing capacitor 10. The potential $V_{CAP}$ appearing across capacitor 10 decreases, finally at time $t_3$ becoming less than the second threshold potential $V_2$. The voltage comparator 20 responds to $V_{CAP}$ becoming less than the second threshold voltage $V_2$ to change $V_{OUT}$ from its second output state back into its first output state. This places switching means 30 back into its high condition at time $t_3$. Thus, switching means 30 again couples high bias voltage from supply 32 to the voltage comparator 20—as a result of the change in the state of its output signal—is supplied with a larger threshold voltage against which $V_{CAP}$ is to be compared. This is a positive feedback mode of operation which latches the comparator output signal in its first state.

Since switching means 30 switches in response to the signal transitions appearing on connection 24, and switching means 14 switches in response to the same signal transitions delayed as they appear on line 42, switching means 30 will have finished switching in response to a signal transition on line 24 at time $t_3$, before switching means 14 responds at time $t_4$, to the same signal transition. Because of the delay from time $t_3$ to time $t_4$, provided by means 40, the discharging current supply 16 continues to discharge capacitor 10 during the period from time $t_3$ to time $t_4$ after switching means 30 has switched to the "hi" state. This delay from time $t_3$ to time $t_4$ insures that the output signal of the voltage comparator 20 is securely latched back into its first state before switching means 14 switches to disconnect the discharging current supply 16 from the capacitor 10. After time $t_4$, when switching means 14 is switched back to its open condition, the charging current supply 12 is permitted to re-charge capacitor 10 to increase $V_{CAP}$; and the cycle of oscillation just described will be repeated.

When the charging current supply 12 is a constant current supply, the capacitor 10 will be charged linearly. When the discharging current supply 16 is a constant current supply, the capacitor 10 will be discharged linearly. $V_{CAP}$ will have the linear sawtooth aveform shown in FIG. 2 when both the supplies 12, 16 are constant current in nature. Alternatively, charging and discharging may be non-linear in nature. For example, exponential charging and discharging via resistors may be employed.

Figure 3:
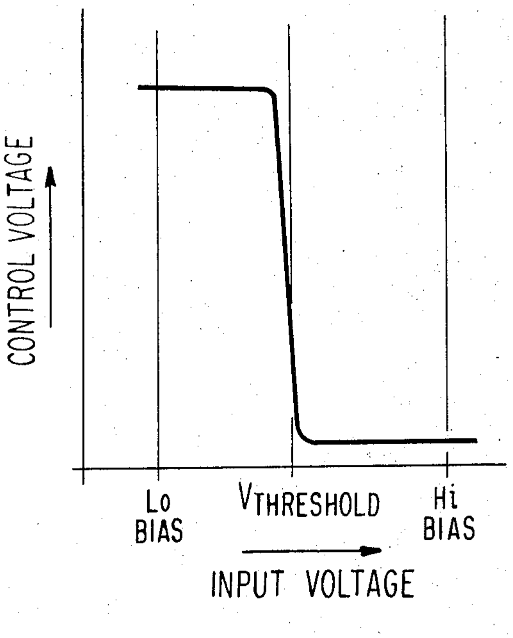
FIG. 3 is the response characteristic of a threshold detector so biased so as to be useful in providing the required delay.

As mentioned above, in a preferred form of the present invention, the delay means 40 comprises a threshold detector. The control voltage provided at the output circuit of such a detector is plotted against the input potential applied to its input circuit in FIG. 3. When a threshold detector is used for delay means 40, its input voltage will correspond to the reference potential signal applied to the voltage comparator 20 from the switching means 30, that is, connection 28 is direct coupled to connection 26.

A threshold detector suitable for use as the delay means 40 will have its threshold potential $V_{THRESHOLD}$ located midway between the low and high bias voltages afforded by supplies 34 and 32, respectively. If the threshold detector displays hysteresis in its detection characteristic, its threshold potentials for increasing input potential and for decreasing input potential must both fall between the low and high bias voltages. (A Schmitt trigger or a selfbiased voltage comparator (like 20) if used as a threshold detector would exhibit such hysteresis in its detection characteristic).

Figure 4:
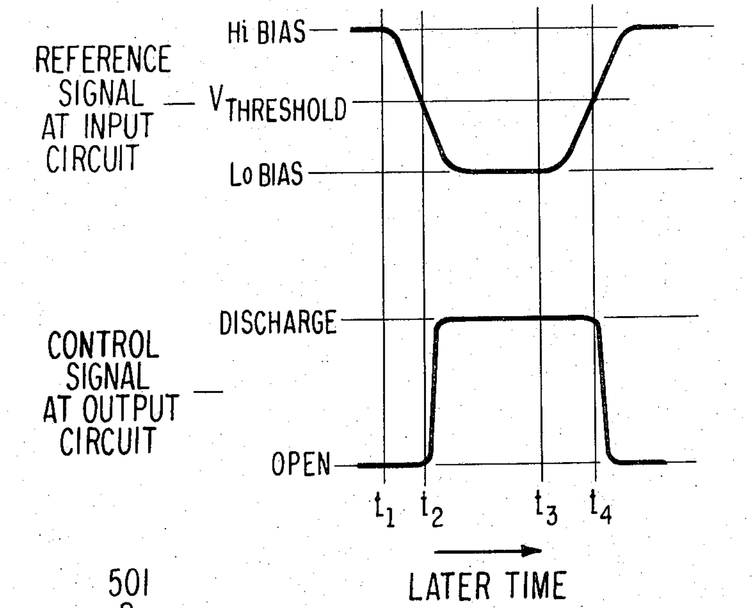
FIG. 4 is a timing diagram illustrative of the operation of the threshold detector in producing the required time delay.

FIG. 4 is a timing diagram useful in understanding how the threshold detector produces delay. The reference input signal pulse corresponds to a pulse indicating the condition of switching means 30 as shown in the FIG. 2 timing diagram. The transistions of the signal between high-bias and low-bias voltage conditions are shown as taking a period of time to complete themselves, rather than being ideal instantaneous transitions.

When the reference potential signal is in its high-bias voltage condition, the control signal is in its low or open state. A transition of the reference potential signal towards its low-bias voltage condition begins at time $t_1$. The control signal at the output circuit of the threshold detector does not begin its transition until time $t_2$, when the reference potential signal crosses $V_{THRESHOLD}$. At time $t_2$, the control signal begins to make its transition, since reference input potential no longer is positive enough to keep the control signal in the condition which directs discharge of the timing capacitor 10. This transition of the control signal is completed as the reference signal potential continues toward low bias voltage.

At time $t_3$ when the reference potential signal begins its transition, it is not sufficiently positive to place the control signal provided by the threshold detector into its state where its directs discharge of the timing capacitor 10. At a later time $t_4$, this transition is sufficiently complete that the reference potential signal crosses $V_{THRESHOLD}$. Thereupon sufficiently positive potential is placed upon the input circuit of the threshold detector to initiate a transition in the control signal appearing at its output circuit. This transition of the control signal is completed as the reference potential signal continues toward high bias voltage.

Figure 5:
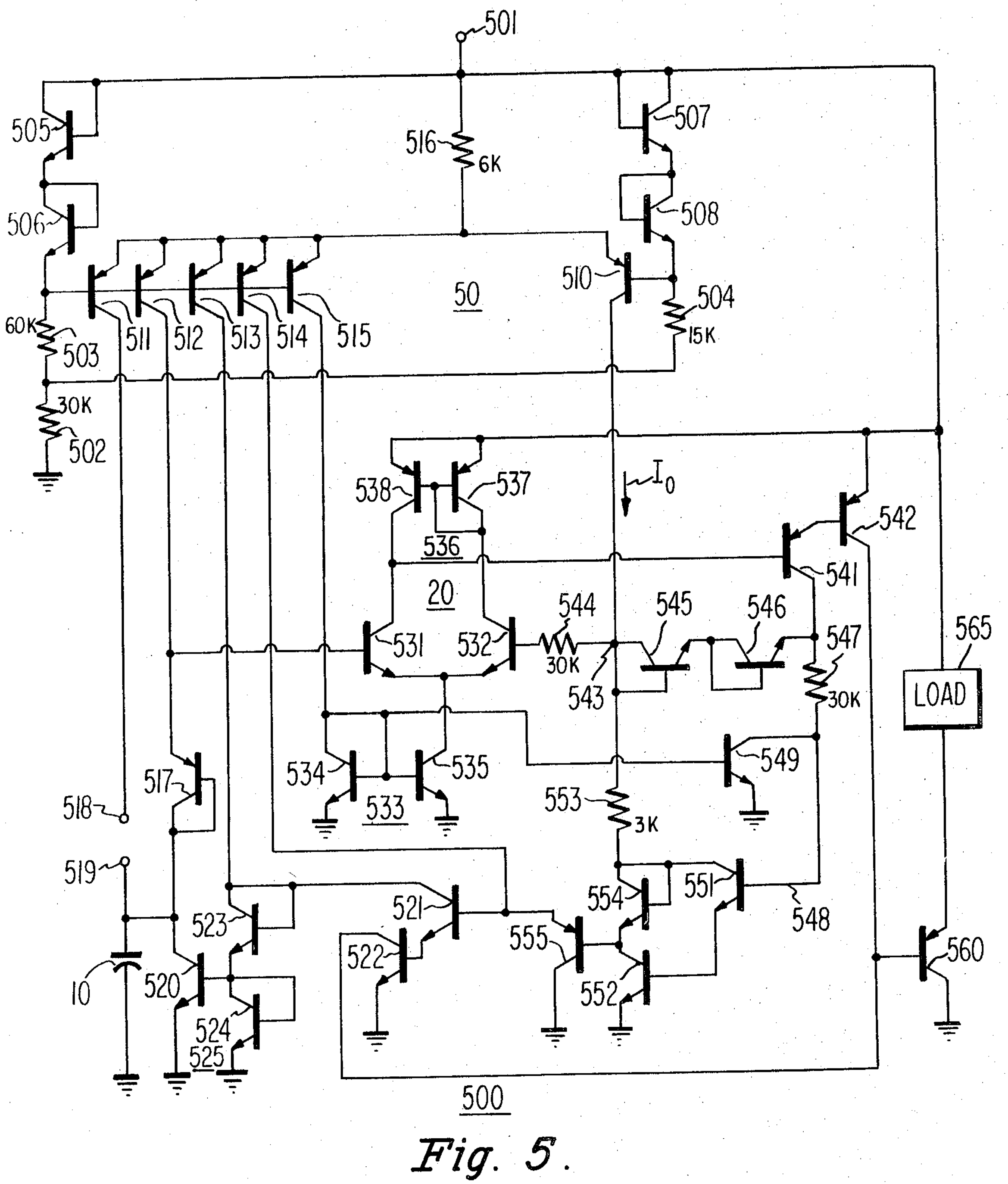
FIG. 5 is a schematic diagram of a preferred embodiment of the present invention.

Referring to FIG. 5, a relaxation oscillator 500 is shown which embodies the present invention and is capable of operation with supply potentials as low as 3 volts applied between terminal 501 and ground.

The oscillator uses a source 50 of currents of the type described in detail in my recently filed copending U.S. Pat. application Ser. No. 365,833 filed June 1, 1974, entitled "Fractional Current Supply" and assigned to RCA Corporation, assignee of the present application. Resistors 502, 503 and 504 maintain a current through diode-connected transistors 505 and 506 and a larger current as shown, four time as large through diode-connected transistors 507 and 508. The $V_{BE}$ offset potentials across diode-connected transistors 505 and 506 are not quite as large as those across diode-connected transistors 507 and 508 for the following reasons:

1. their base-emitter areas are larger than those of transistors 507 and 508 by a factor of $n$ and
2. their emitter currents are smaller (as shown, one quarter as large).

This difference in voltage is applied between the base electrode of transistor 510 and the joined base electrodes of transistors 511, 512, 513, 514 and 515. (A $V_{BE}$ offset potential is the voltage appearing across the base-emitter junction of a transistor when that junction is forward-biased and is about 0.6 volt for a silicon transistor).

A voltage substantially equal to a $V_{BE}$ offset, appears across resistor 516 and determines the current therethrough in accordance with Ohm's Law. If silicon transistors and a 6 kilohm resistor 516 are used, this current will be 100 microamperes, approximately. When applied to the joined emitter electrodes of transistors 510, 511, 512, 513, 514 and 515, this current is split into various fractions to supply their emitter currents. The configuration may be regarded as an emitter-coupled transistor differential amplifier formed from transistor 510 and another "composite" transistor having its effective base-emitter circuit provided by the parallelled base-emitter circuits of transistors 511, 512, 513, 514 and 515. The effective base-emitter junction areas of transistor 510 and of the "composite" transistor are arbitrarily made equal.

Because the potential at the base electrode of 510 is less positive than that at the joined electrode of transistors 511, 512, 513, 514 and 515, the collector current of transistor 510 will be $4n^2$ times as large as the combined collector currents of transistors 511, 512, 513, 514 and 515. Therefore, the collector current $I_0$ of transistor 510 will be substantially equal to the current flowing in resistor 516. The combined collector currents of transistors 511, 512, 513, 514 and 515 sum to $I_0/4n^2$. The effective base-emitter junction areas of transistors 511, 512, 513, 514 and 515 are in ratio $(1-a)$:1:1:1 and their collector currents consequently are in like ratio. In a practical design, $n$ and $a$ are made equal o 4 and one-fourth, respectively, and the collector currents of transistors 510, 511, 512, 513, 514 and 515 are approximately 90, 0.3, 0.1, 0.4, 0.4 and 0.4 microamperes, respectively.

The collector current of transistor 512 is coupled through a diode-connected lateral transistor 517 to timing capacitor 10. Terminal 518 at the collector electrode of transistor 511 may be grounded; or alternatively may be connected to terminal 519 to increase the charging rate of timing capacitor 10 by a factor $1/a$ (equaling 4 according to previous presumptions). This circuitry corresponds to the charging current supply 12 of FIG. 1. So long as transistor 520 is non-conductive, the collector current of transistor 512 (and of transistor 511 if terminals 518 and 519 are connected) will charge timing capacitor 10.

The collector current of transistor 513, when transistors 521 and 522 are non-conductive, will be coupled to serially-connected diode-connected transistors 523, 524. A current amplifier 525 is formed by the parallel connection of the base-emitter junctions of transistors 524 and 520 and by the negative collector-to-base feedback connection 526 of transistor 524. The current amplifier 525 has a gain equal to the ratio between the effective areas of the base-emitter junction of transistors 520 and that of transistors 524. In a practical circuit, this gain is 4. The collector current of transistor 520 provides the discharging current supply 16 of FIG. 1.

In the FIG. 5 configuration, the switching means used to interrupt the discharge of capacitor 10 is the transistor 520. Such interruption is achieved by placing the base of transistor 520 at a level sufficiently low that substantially no conduction occurs through the emitter-collector path of this transistor thereby opening the discharge path of the capacitor as illustrated in FIG. 1.

The above is accomplished in the following way. A sufficiently positive potential is applied to the base electrode of transistor 521 to bias it and transistor 522 into pronounced conduction. As transistor 521 saturates, its collector potential is clamped to the $V_{BE}$ offset appearing at the base electrode of transistor 522. This potential is in sufficiently large to bias the serially connected diode-connected transistors 523, 524 into conduction. Consequently, the base-emitter potential applied to transistor 520 is too small to support appreciable collector current flow therein.

The potential $V_{CAP}$ developed across the timing capacitor 10 appears on terminal 519 and is coupled via a diode-connected transistor 517 to a voltage comparator 20. The voltage comparator 20 in this instance, is an emitter-coupled transistor differential amplifier basically comprising transistors 531, 532 and arranged to compare potentials applied to their base-electrodes. A voltage equal to $V_{CAP}$ plus the $V_{BE}$ offset across diode 517 is applied to the base electrode 531.

A current amplifier 536 comprising similar lateral transistors 537, 538 converts the push-pull collector currents of transistors 531, 532 into a single-ended potential for application to later circuitry.

The collector current of transistor 515, $I_{C515}$, is applied to a current amplifier 533 comprising transistors 534, 535 and 549; and collector currents proportional to $I_{C515}$ flow in transistors 535 and 549. When the potential at the base electrode of transistor 531 is more positive than that of the base electrode of transistor 532, the collector current of transistor 535 will be provided from the collector-to-emitter path of transistor 531. The collector current flow of transistor 531 tends to make the potential at the base-electrode of transistor 541 less positive, which biases the cascaded base-emitter junctions of transistors 541, 542 into conductor. The collector current of transistors 531 flows as base current to transistor 541.

When the potential on the base electrode of transistor 531 is less positive than that on the base electrode of transistor 532, the collector current of transistor 535 will be provided from collector-to-emitter of transistor 532. This current must flow in the input circuit of current amplifier 536 and thus cause collector current flow in transistor 538. The conduction of transistor 538 clamps the base electrode of transistor 541 to the potential applied to terminal 501 and prevents the conduction of transistors 541 and 542.

When transistor 541 is non-conductive, a potential of substantially $4V_{BE}$ appears at node 543, which is coupled via resistor 544 to the base electrode of transistor 532. This $4V_{BE}$ potential is determined as follows. A portion of the collector current of transistor 510 flows via diode-connected transistors 545, 546 and resistor 547 to a node 548. A transistor 549 in current amplifier connection with diode-connected transistor 534 withdraws a small portion of this current, thereby discharging any charge build-up on stray capacitance associated with resistor 547, but the rest flow to forward bias the base-emitter junctions of transistors 551 and 552.

The transistor 552 is biased sufficiently into forward conduction that its collector current (withdrawn from node 543 via resistor 553 and diode-connected transistor 554) comprises most of the current $I_0$ supplied to node 543 from the collector electrode of transistor 510. The potential at node 543 is the sum of the potential drops across diode-connected transistors 545 and 546 ($1V_{BE}$ each), the resistor 547 (substantially less than $1V_{BE}$ since current flow therethrough is not great) and the base-emitter junctions of transistors 551 and 552 ($1\ V_{BE}$ each). This arrangement for maintaining node 543 at substantially $4V_{BE}$ potential when transistor 541 is non conductive, is a shunt regulation arrangement with transistor 552 acting as the shunt regulator transistor because of direct-coupled collector-to-base feedback applied via elements 545, 546, 547 and 551.

Resistor 553 has substantially 0.5 $V_{BE}$ potential drop thereacross, since its resistance is one-half that of resistor 516 through which a current substantially equal to $I_0$ also flows and across which a $1V_{BE}$ potential drop is maintained. Diode-connected transistor 554 has a $1V_{BE}$ potential drop thereacross. So, if node 543 is at $4V_{BE}$ potential, the base electrode of transistor 555 will be at a 2.5 $V_{BE}$ potential when transistor 541 is non-conductive.

The emitter electrode of transistor 555 is constrained to be no more positive than 2 $V_{BE}$ by the clamping action of the serially connected base-emitter junctions of transistors 521 and 522, which are maintained in forward-bias by the collector current of transistor 514. Consequently, transistor 555 is non-conductive for the condition where transistor 541 is non-conductive. The pronounced forward bias applied to transistor 522 causes it to supply substantial collector current to the base-electrode of transistor 560 biasing it to provide potential across load 565. The conduction of transistor 521 as heretofore explained, prevents collector current flow from transistor 520.

Thus, when the potential at the base electrode of transistor 531 is less positive than that at the base electrode of transistor 532, the following conditions obtain:

1. transistors 541 and 542 are non-conductive;
2. transistors 521 and 522 are conductive;
3. transistor 560 is biased to apply potential across load 565;
4. the base electrode of transistor 532 is at substantially 4 $V_{BE}$ potential;
5. transistor 520 does not conduct and therefore cannot discharge timing capacitor 10; and
6. transistor 512 (and transistor 511 if terminals 518 and 519 are connected) charges timing capacitor 10, causing the potential thereacross to increase.

The charging of timing capacitor 10 will proceed until the potential at the base electrode of transistor 531 becomes more positive than the substantially 4 $V_{BE}$ potential appearing at the base electrode of transistor 532. Then, the voltage comparator 20 will switch to make transistors 541 and 542 conductive.

The conduction of transistor 541 causes the potential node 548 and the potential at the collector of transistor 541 each to increase a bit. This reverse biases diode-connected transistors 545 and 546. The collector current of transistor 541 exceeds the collector current demand of transistor 549 and forces an increase of the base current to transistor 551. The common-collector amplifier action of transistor 551 forces an increase in the base current of transistor 552 and thereby overrides the shunt regulating action of transistor 552. The collector current of transistor 552 increases pulling down the base electrode of transistor 555 toward ground potential. The potential drop across elements 553 and 554 remains substantially 1.5 $V_{BE}$ since $I_0$ continues to be supplied to them from the collector of transistor 510. So, node 543 begins to follow the base potential of transistor 555 toward ground. This tends to make the potential at the base electrode of transistor 532 less positive with respect to that at the base electrode of transistor 531, providing positive feedback to reinforce the transition of the potential on node 543 from 4 $V_{BE}$ to a lower value. This positive feedback provides latching of the voltage comparator 20 as described above in connection with the FIG. 1 diagram.

The potential at the collector electrode of transistor 552 must fall to about 1 $V_{BE}$ above ground potential before the base-emitter junction of transistor 555 will be forward-biased. Since the offset potential across elements 553 and 554 is 1.5 $V_{BE}$, the collector electrode of transistor 552 will have fallen to about 2.5 $V_{BE}$ before transistor 555 begins to conduct. During this interval, the collector current of transistor 514 has flowed to the base electrode of transistor 521, maintaining transistors 521, 522 and 560 conductive and transistor 520 non-conductive. The timing capacitor 10 has continued to charge during this time, thereby preventing an undesirable equilibrium condition from occuring in the relaxation oscillator.

As the base potential of transistor 555 is pulled below 1 $V_{BE}$ by the increased collector current of transistor 552, the base-emitter junction of transistor 555 becomes conductive. As transistor 552 pulls the base electrode of transistor 555 closer to ground, its emitter-follower action reverse-biases the base-emitter junctions of transistors 521 and 522. The collector current of transistor 513 is diverted to flow through the emitter-to-collector path of transistor 555. Since transistor 522 is no longer conductive and since transistor 542 is conductive, the potential at the base electrode of transistor 560 becomes more positive and biases it out of conduction. Since transistors 521 is no longer conductive, transistor 520 is biased into conduction to discharge the timing capacitor 10.

The base potential of transistor 555 continues to decrease because the positive feedback loop provided by voltage comparator 20 and elements 541, 547, 551, 552, 554, 553 and 544 is still operative to supply increased base current to transistor 552. Transistor 552 saturates with its collector potential nearly at ground potential.

The diode-connected transistor 554 supplies transistor 551 with sufficient collector potential to maintain its collector-base junction reverse-biased until transistor 552 can be saturated. Thus, there is no loss of common-emitter forward current gain in transistor 551 before transistor 522 has its base-emitter junction sufficiently forward biased to place it into saturation. Thereafter, sustained base current flow to transistor 551 from transistor 541 saturates transistor 551, clamping its collector potential to its emitter potential (the one $V_{BE}$ offset appearing across the base-emitter junction of transistor 552). The collector current flow in transistor 552 cannot exceed $I_O$ supplied through node 543 and resistor 553, so dissipation in transistor 552 cannot become excessive.

Thus, when the potential at the base electrode of transistor 531 is more positive than that at the base electrode of transistor 532 the following condition obtains:

1. transistors 541 and 542 are conductive;
2. transistors 521 and 522 are non-conductive;
3. transistor 560 is biased such that no potential is applied to load 565;
4. the base electrode of transistor 532 is at substantially 1.5 $V_{BE}$ potential;
5. diode-connected transistors 545 and 546 are non-conductive by reason of their base-emitter junctions being reverse-biased, the collector potential of transistor 541 exceeding the 2 $V_{BE}$ potential at node 548 and the potential at node 543 being only 1.5 $V_{BE}$, and
6. transistor 520 conducts to discharge timing capacitor 10.

The discharging of timing capacitor 10 will proceed until the potential at the base electrode of transistor 531 becomes less positive than the substantially 1.5 $V_{BE}$ potential at the base electrode of transistors 532. Then, the voltage comparator 20 will switch to saturate transistor 538 and remove transistors 541 and 542 from conduction.

With no collector current being provided from transistor 541, the collector current of transistor 549 brings node 548 closer to ground potential, reducing the potential at node 548 and so biasing transistors 551 and 552 for reduced conduction. The collector current $I_O$ of transistor 510 exceeds the combined collector currents of transistors 551 and 552. The potential at node 543 rises, and the base potential of transistor follows with a 1.5 $V_{BE}$ offset as developed across elements 553 and 544. To remove transistor 555 from conduction its base potential must rise from the collector saturation potential of transistor 552 (which is only about 0.1 volt) to about 1 $V_{BE}$. Thus, node 543 will rise to 2.5 $V_{BE}$, approximately, before transistor 555 begins to be biased out of conduction.

Transistor 520, which has been discharging timing capacitor 10 until transistor 555 is biased out of conduction, will have reduced the potential across capacitor 10 to less than 1.5 $V_{BE}$, while node 543 has been pulled up to 2.5 $V_{BE}$. The voltage comparator 20 is therefore securely latched into the state in which transistor 532 is conductive and in which transistor 555 and subsequently transistor 520 are biased out of conduction. This is a positive feedback condition which was described in connection with the FIG. 1 diagram.

The collector current $I_O$ of transistor 510 continues to pull up node 543, biasing diode-connected transistors 545 and 546 into conduction. Transistor 552 resumes its shunt regulator action to hold node 543 at substantially 4 $V_{BE}$ potential.

Threshold detection is accomplished in the FIG. 5 configuration by transistor 555 controlling whether the current supplied from the collector electrode of transistor 514 is (1) applied to the base-emitter junctions of transistors 521, 522 or (2) is diverted to flow in its own emitter-to-collector path. The threshold of the detector is crossed when the base electrode of transistor 555 crosses +1 $V_{BE}$ potential. The threshold potential is determined by the $V_{BE}$ offsets of the base-emitter junctions of transistors 522, 521 and 555.

The potential required on bus 501 to operate the relaxation oscillator is only about 5 $V_{BE}$, a bit more than 3 volts when silicon transistors are used. The base electrodes of transistors 531 and 532 must be permitted to rise to 4 $V_{BE}$ potential. Therefore, transistors 510 and 514 must have their base electrodes biased more positive than 3 $V_{BE}$ potential to maintain their collector-base junctions reverse-biased. The potential on bus 501 is 2 $V_{BE}$ higher as determined by the offset potential of diode-connected transistors 504, 505, 506 and 507. The operating currents required by the relaxation oscillator itself are minimal, principally comprising the 0.1 milliampere current supplied via resistor 516 and the rest of the current supply 50 to the rest of the circuit.

In one design, the timing capacitor 10 comprises the 11 picofarads total capacitance of the collector-to-substrate capacitance of transistor 520. A 10 microsecond pulse is provided to load 565, recurring at 40 microsecond intervals with terminals 518 grounded and at 130 microsecond intervals with terminal 518 connected to terminal 519. An external capacitor connected between terminal 519 and a ground terminal (not shown) can be used to reduce the oscillation frequency further. Terminal 519 can be short-circuited to terminal 501 to stop the relaxation oscillations.

The preferred embodiments of the present invention so far described herein have used a constant charging current supply and a switched discharging current supply. Conversely, a switched charging current supply and a constant discharging current supply may be used. Also both supplies may be switched alternately to charge and to discharge the timing capacitor 10. Further, the supplies need not necessarily be of the constant current type.

The relaxation oscillator 500 is well suited to generate various sorts of modulated carriers, if it is properly modified. If it is desired to modulate the frequency of the relaxation oscillator 500 in response to a modulating signal, the transistors 511, 512 and 513 are not biased with fixed bias from a source 50 of currents as shown in FIG. 5. Rather, transistors 511, 512, and 513 are arranged to have their collector currents modulated in inverse proportion to the modulating signal.

If it is desired to provide pulse duration modulation, the collector current of transistor 513 is modulated in proportion to the modulating signal, and transistors 511 and 512 are arranged as in the FIG. 5 configuration, to provide constant collector current flow. If it is desired to provide pulse position modulation, transistors 511 and 512 are arranged to have their collector currents modulated in proportion to the modulating signal, and transistor 513 is arranged to provide constant collector current flow. Arranging transistors 511 and 512 to have their collector currents modulated in inverse proportion to modulating signal, while the collector current of transistor 513 is maintained constant, provides for pulse frequency modulation.

Figure 6:
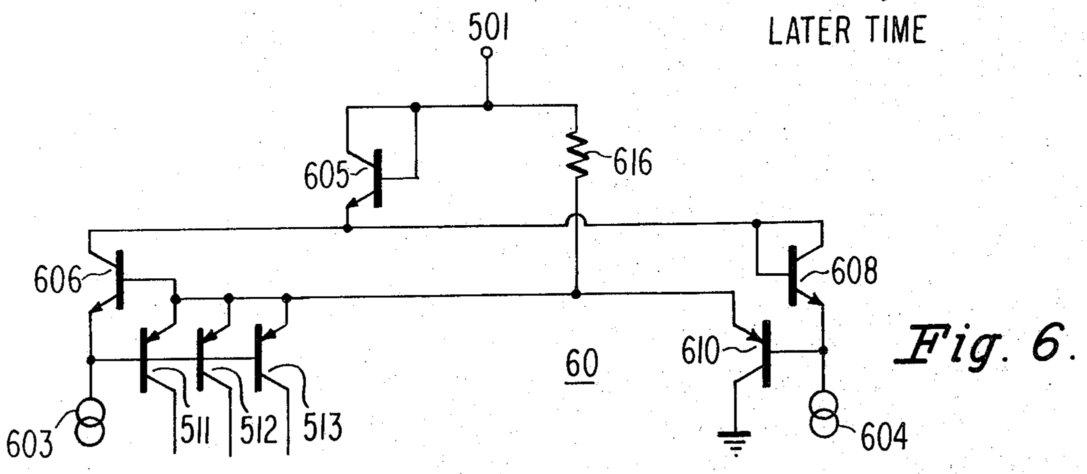
FIG. 6 is a schematic diagram of an alternative circuit arrangement to be used in the FIG. 5 relaxation oscillator when it is desired to modulate the frequency of its output signal.

FIG. 6 shows in detail modulating circuitry 60 which can be used to bias transistors 511, 512, and 513 to permit modulation of the frequency or the period of the relaxation oscillations. Transistors 511, 512 and 513 are no longer included in source 50 of currents, but rather in a source 60 of currents. A current generator 603 draws a current $I_A$, principally through diode-connected transistor 606 to develop a $V_{BE}$ offset potential $V_{BE606}$ thereacross. A current generator 604 draws a current $I_B$ principally through diode-connected transistors 608 to develop a $V_{BE}$ offset potential $V_{BE608}$ thereacross. A current substantially equal to $(I_A + I_B)$ is consequently drawn through diode-connected transistor 605 to develop a $V_{BE}$ offset potential $V_{BE605}$ thereacross.

The base potentials of transistors 511, 512, 513 and of transistor 610 are offset from the potential on terminal 501 by potentials $V_A$ and $V_B$, respectively, each being a $2V_{BE}$ potential; and their emitter potentials are offset from the potential on terminal 501 by $1V_{BE}$. This $1V_{BE}$ offset potential impressed upon resistor 616 causes a current flow $I_T$ therethrough in accordance with Ohm's Law. $I_T$ is split into two fractions, $I_1$ flowing through the base-emitter junctions of transistors 511, 512 and 513 and $I_2$ flowing through the base-emitter junction of transistor 610.

The porportions of $I_1$ and $I_2$ are governed by (1) the relative magnitudes of the currents $I_A$ and $I_B$ and (2) the proportions of the base-emitter junctions of transistors 511, 512, 513, 606, 608 and 610. These transistors may be assumed to have similar diffusion profiles so that their base-emitter junction proportions can be expressed in terms of their relative areas. The base-emitter junction of transistor 606 has an area $A_{606}$ $n$ times as large as the base-emitter junction area $A_{608}$ of transistor 608. The base-emitter junction of transistor 610 is made to have an area $A_{610}$ $m$ times as large as the combined areas of the base-emitter junctions of transistors 511, 512 and 513.

The expression defining semiconductor junction diode operation is well known to be:

$$V = (kT/q)\ 1n\ (I/AJ_o) \qquad (1)$$

where:

- $V$ is the offset voltage across the diode ($V_{BE}$ in the case of a transistor);
- $k$ is Boltsmann's constant;
- $T$ is absolute temperature;
- $q$ is the charge on an electron;
- $I$ is current through the junction (emitter current in the case of a transistor);
- $A$ is the area of the semiconductor junction (base-emitter junction area in the case of a transistor); and
- $J_o$ is the saturation current density in the semiconductor junction.

Proceeding from this expression, the following approximate expression describing $I_1$ in the configuration of FIG. 6 can be derived:

$$I_1 = (I_T/mn)\ (I_A/I_B) \qquad (2)$$

$I_1$ is the current which determines the period of the relaxation oscillations in the oscillator 500, as modified by the FIG. 6 circuitry. By causing $I_A$ to be substantially constant and $I_B$ to be modulated, the relaxation oscillation will be frequency-modulated in proportion to the variations of $I_B$. Conversely, by causing $I_B$ to be substantially constant and $I_A$ to be modulated, the period of the relaxation oscillations will be modulated in proportion to the variations of $I_A$.

The derivation referred to in the previous paragraph proceeds as follows:

$$V_A = V_{BE605} + V_{BE606} \qquad (3)$$

$$V_B = V_{BE605} + V_{BE608} \qquad (4)$$

$$V_A - V_B = V_{BE606} - V_{BE608} \qquad (5)$$

$$V_A - V_B = (kT/q)\ 1n\ (I_A/A_{606}\ T_o - kT/q)\ 1n\ (I_B/A_{608}\ J_o) \qquad (6)$$

$$V_A - V_B = (kT/q)\ 1n\ (I_A/nA_{608}\ J_o - kT/q)\ 1n\ (I_B/A_{608}\ J_o) \qquad (7)$$

$$V_A - V_B = (kT/q)\ 1n\ (I_A/nI_B) \qquad (8)$$

This expression defines the potential to be amplified by the differential amplifier formed by transistors 511, 512 and 513 acting in conjunction with transistor 610.

$$V_A = I_T R616 + V_{BE511} \qquad (9)$$

$$V_B = I_T R616 + V_{BE610} \qquad (10)$$

$$V_A - V_B = V_{BE511} - V_{BE610} \quad (11)$$

$$V_A - V_B = (kT/q\ \ln)\,[I_1/(A_{511}+A_{512}+A_{513})\,J_o] - (kT/q)\ \ln\ (I_2/A_{610}\ J_o) \quad (12)$$

$$V_A - V_B = (kT/q)\ \ln\ (I_1/A_{610}/m\ J_o - kT/q)\ \ln\ I_2/A_{610}\ J_o \quad (13)$$

$$V_A - V_B = (kT/q)\ \ln\ (mI_1/I_2) \quad (14)$$

Cross-solving equations 8 and 14, $$(kT/q)\ \ln\ (I_1/m_{I_2}) = (kT/q)\ \ln\ (I_A/nI_B) \quad (15)$$

$$I_1/I_2 = I_A/mnI_B \quad (16)$$

$$I_1 = I_2/mn\ I_A/I_B \quad (17)$$

If $I_1$ is made much smaller than $I_2$, then $I_2$ is substantially equal to $I_T$, providing the approximate expression set forth in equation 2 above.

The percentage error in this approximation is 100 $I_1/I_2$. From equation 16 above, it can be seen that this error can be reduced to any desired limit by appropriate choices of $m$, $n$ and $I_A/I_B$. These choices should be made so that $I_1$ is appreciably smaller than $I_2$—that is, so that $I_1$ is only a small fraction of $I_T$.

What is claimed is:

1. In a relaxation oscillator having a timing capacitor with a first terminal connected to a direct potential and with a second terminal, a voltage comparator for comparing potential at the second terminal of said timing capacitor against a reference potential to provide an output signal having a first state which obtains when said compared potential is positive with respect to said reference potential and a second state which obtains when said compared potential is negative with respect to said reference potential, means switchably controlled in response to said comparator output signal to supply a relatively negative reference potential to said voltage comparator when said comparator output signal is in its first state and to supply a relatively positive reference potential to said voltage comparator when said comparator output signal is in its second state, delay means for providing a control signal having a first and a second states in response respectively to said first and to said second states of said comparator output signal but delayed with respect thereto, and means switchably controlled in response to said control signal to discharge said timing capacitor when said control signal is in its first state and to charge said timing capacitor when said control signal is in its second state, improved delay means comprising:

a threshold detector having an input circuit coupled to receive said reference potential signal and having an output circuit from which said control signal is provided in response to said reference potential, the threshold signal level of said threshold detector as referred to its said input circuit arranged between the signal levels characteristic of said first and said second states of said comparator output signal.

2. A relaxation oscillator comprising:

a timing capacitor having a first terminal referred to a reference potential and having a second terminal;

means switchably controlled in response to a control signal, to discharge said timing capacitor when said control signal is in a first state and to charge said timing capacitor when said control signal is in a second state;

a voltage comparator comprising a first and a second transistors of like conductivity, said first transistor having a base electrode connected to said second terminal of said timing capacitor, said second transistor having a base electrode, said first and said second transistors being connected in an emitter-coupled voltage comparator configuration having an output circuit adapted for providing an output signal of a first or a second state depending upon whether the potential on said first transistor base electrode is more positive or more negative than the potential at said second transistor base electrode;

a node to which said second transistor base electrode is direct coupled;

means for clamping said node to a first direct potential responsive to one of the states of said voltage comparator output signal;

means for applying a second direct potential to said node when the other of said states of said voltage comparator output signal obtains and a threshold detector providing said control signal responsive to whether said first or said second direct potential appears at said node, thereby providing a delay necessary to avoid an equilibrium condition in said relaxation oscillator wherein oscillations would be undesirably curtailed.

3. A relaxation oscillator as claimed in claim 2 wherein said means for clamping said node to a first direct potential comprises:

a third transistor having a base and a collector electrodes and having an emitter electrode referred to said reference potential;

means direct coupling said third transistor base electrode to said voltage comparator output circuit, and means direct coupling said third transistor collector electrode to said node, whereby said third transistor is biased into saturation responsive to said one of the states of said voltage comparator output signal thereby to provide clamping.

4. A relaxation oscillator as claimed in claim 3 wherein said means for applying a second direct potential to said node comprises:

a direct coupled negative feedback connection from the collector electrode of said third transistor to its base electrode.

5. A relaxation oscillator as claimed in claim 4 wherein said direct coupled negative feedback connection includes:

at least one semiconductor junction poled to be forward-biased when said third transistor is not biased into saturation.

6. A relaxation oscillator as claimed in claim 3 wherein said threshold detector comprises:

a fourth and a fifth transistors, being of respective conductivity types complementary to and same as the conductivity type of said third transistor, each having a base and an emitter and a collector electrodes, said fourth transistor base electrode being direct coupled to said third transistor collector electrode, means for supplying direct current flow between first and second terminals thereof, said first terminal thereof being direct current conductively coupled to an interconnection of said fourth transistor emitter electrode and said fifth transistor base electrode, said second terminal thereof being direct current conductively coupled to said fourth transistor collector electrode and to said fifth transistor emitter electrode, and means for connecting said fifth transistor collector electrode to said switchably controlled means to provide said control signal thereto.

7. A relaxation oscillator as claimed in claim 6 having:

a sixth transistor being of the same conductivity type as said third transistor, said sixth transistor having a base-emitter junction included in said means direct coupling said third transistor base electrode to said voltage comparator output circuit, said sixth transistor having a collector electrode, and a semiconductor junction, being included in said means direct coupling said third transistor collector electrode to said node and more particularly being connected between said sixth transistor collector electrode and an interconnection of said third transistor collector electrode and said fourth transistor base electrode.

8. A relaxation oscillator as claimed in claim 2 wherein said means switchably controlled in response to a control signal comprises:

means for providing a first and a second direct currents, said first current being applied directly to said timing capacitor second terminal, a current amplifier having an input circuit and having an output circuit coupled to said timing capacitor second terminal, means having a path of adjustable conductivity controlled in response to said control signal and a parallel connection of said path of adjustable conductivity and said current amplifier input circuit to which said second current is applied.

9. A relaxation oscillator as claimed in claim 8 wherein said means for clamping said node to a first direct potential and said threshold detector together comprise:

a third and a fourth transistors of a same conductivity type and a fifth transistor of a complementary conductivity type, each having a base and an emitter and a collector electrodes, said fourth transistor having a collector-to-emitter path connected as said path of adjustable conductivity and accepting said control signal at its said base electrode, said third transistor collector electrode being connected to said fifth transistor base electrode, said fifth transistor collector electrode being coupled to said reference potential;

means for referring the emitter electrodes of said third and said fourth transistors to said reference potential and for providing an offset potential therebetween;

means direct coupling said third transistor base electrode to said voltage comparator output circuit;

means direct coupling said third transistor collector electrode to said node;

an interconnection between said fourth transistor base electrode and said fifth transistor emitter electrode; and means for providing a third current to said interconnection.

10. In a relaxation oscillator, in combination:

a comparator having first and second input terminals and an output terminal;

charge storage means connected to said first input terminal;

means coupled to said other second input terminal for applying a voltage thereto at a given first level;

means coupled to said charge storage means for charging the same;

means coupled to said output terminal and responsive to the signal which occurs when the voltage across said charge storage means exceeds the voltage at said second input terminal for reducing the voltage applied to said second input terminal to a second lower level; and means including a lumped element delay means for disabling said storage means after said voltage applied to said second input terminal has been reduced to said second level.

11. In a relaxation oscillator as set forth in claim 10, said lumped element delay means comprising a threshold detector coupled to said second input terminal and responsive to a voltage intermediate said first and second levels.

12. In a relaxation oscillator, in combination:

a voltage comparator having a first and a second input terminals and an output terminal for supplying an output signal having a first and a second levels depending upon which of the input terminals is at a more positive potential than the other;

charge storage means connected to said first voltage comparator input terminal;

means for applying a signal potential to said second voltage comparator input terminal which signal potential has a first and a second levels respectively responsive to said first and said second levels of the signal appearing at said voltage comparator output terminal;

lumped element delay means having an input circuit coupled to said second voltage comparator input terminal and having an output circuit for providing a control signal having a first and a second states in delayed response to separate ones of said signal potential levels applied to said second voltage comparator input terminal; and a controlled source of current coupled to said charge storage means responsive to said first and said second states of said control signal respectively to increase or to decrease the charge stored therein.

13. In a relaxation oscillator as set forth in claim 12, said lumped element delay means comprising a threshold detector coupled to said second input terminal and responsive to a voltage intermediate said first and second levels of said signal potential.

14. In a relaxation oscillator as set forth in claim 12 said controlled source of current comprising:

a first and a second transistors each having an input and a common and an output electrodes;

means for applying a bias potential between the input and the common electrodes of each of said first and said second transistors to bias it for current flow between its output and common electrodes;

means direct coupling the output and common electrodes of said first transistor to said charge storage means;

a current amplifier having an input circuit to which said second transistor collector and common electrodes are directed coupled and having an output circuit direct coupled to said charge storage means; and means for diverting said current flow between the output and common electrodes of said second transistor from flowing in said current amplifier input circuit, in response to one of said control signal states.

15. In a relaxation oscillator as set forth in claim 14 said means for applying bias potential between the input and common electrodes of each of said first and said second transistors including:

a third transistor having an input and a common and an output electrodes;

current supplying means coupled between an interconnection of the emitter electrodes of said first, said second and said third transistors and their collector electrodes;

a first and a second semiconductor junctions each having a first and a second electrodes, their said second electrodes being connected together and to a point of reference potential; said first electrode of said first semiconductor junction being connected to the joined base electrodes of said first and said second transistors, said first electrode of said second semiconductor junction being connected to said third transistor base electrode;

means adapted for supplying a first bias current to the first electrode of said first semiconductor junction; and means adapted for supplying a second bias current and a modulating current superimposed thereon to the first electrode of said second semiconductor junction.

16. In a relaxation oscillator as set forth in claim 14 said means for applying bias potential between the input and common electrodes of each of said first and said second transistors including:

a third transistor having an input and a common and an output electrodes;

current supplying means coupled between an interconnection of the emitter electrodes of said first, said second and said third transistors and their collector electrodes;

a first and a second semiconductor junctions each having a first and a second electrodes, their said second electrodes being connected together and to a point of reference potential; said first electrode of said first semiconductor junction being connected to the joined base electrodes of said first and said second transistors, said first electrode of said second semiconductor junction being connected to said third transistor base electrode;

means adapted for supplying a first bias current to the first electrode of said second semiconductor junction; and means adapted for supplying a second bias current and a modulating current superimposed thereon to the first electrode of said first semiconductor junction.

17. A relaxation oscillator having a timing capacitor with a first terminal connected to a direct potential and with a second terminal, a voltage comparator for comparing potential at the second terminal of said timing capacitor against a reference potential signal to provide an output signal having a first state which obtains when said compared potential is positive with respect to said reference potential and a second state which obtains when said compared potential is negative with respect to said reference potential, delay means for providing a control signal having a first and a second states in response respectively to said first and to said second states of said comparator output signal but delayed with respect thereto, and means switchably controlled in response to said control signal for discharging said timing capacitor when said control signal is in its first state and for charging said timing capacitor when said control signal is in its second state, said relaxation oscillator having included within said switchably controlled means means for varying the timing of its oscillations characterized by comprising:

a first and a second transistor each having a base and an emitter electrodes and a base-emitter junction therebetween and each having a collector electrode, their said emitter electrodes being joined together by direct connection;

means for providing a current to be proportioned between the base-emitter junctions of said first and said second transistors, said means coupling the joined emitter electrodes of said first and said second transistors to their collector electrodes;

a first and a second semiconductor junctions each having a first electrode, which are respectively connected to separate ones of the base electrodes of said first and said second transistors, and each having a second electrode connected to a point of reference potential;

means adapted for supplying a first bias current to the first electrode of the first semiconductor junction;

means adapted for supplying a second biasing current and a modulating current superimposed thereon to the first electrode of said second semiconductor junction; and means coupling the collector current of said first transistor to said capacitor to alter the charge thereupon.

* * * * *

Disclaimer 3,831,113.—*Adel Abdel Aziz Ahmed*, Annandale, N.J. RELAXATION OSCILLATOR. Patent dated Aug. 20, 1974. Disclaimer filed September 30, 1976, by the assignee, *RCA Corporation*.

Hereby enters this disclaimer to claims 1, 10, 11, 12 and 13 of said patent.

[*Official Gazette December 7, 1976.*]